United States Patent [19]
> Stacey

[11] Patent Number: 4,963,839
[45] Date of Patent: Oct. 16, 1990

[54] WIDE BANDWIDTH PHASE LOCKED LOOP CIRCUIT WITH SLIDING WINDOW AVERAGER

[75] Inventor: Eric J. Stacey, Penn Hills Twp., Pa.

[73] Assignee: Westinghouse Electric Corp., Pittsburgh, Pa.

[21] Appl. No.: 401,672

[22] Filed: Sep. 1, 1989

[51] Int. Cl.⁵ .................. H03L 7/087; H03L 7/093; H03L 7/18

[52] U.S. Cl. ....................................... 331/17; 331/12; 331/45

[58] Field of Search .............. 331/1 A, 12, 17, 25, 331/45; 328/155

[56] References Cited

U.S. PATENT DOCUMENTS

4,463,432  7/1984  Carter, II ............................ 364/483
4,468,632  8/1984  Crowley ........................... 331/17 X
4,669,024  5/1987  Stacey .................................. 361/85
4,811,236  3/1989  Brennen et al. ..................... 364/483

Primary Examiner—Siegfried H. Grimm

[57] ABSTRACT

Broadband, single and multiphase phase lock loop circuits utilize a sliding window averager to remove the second harmonic and other ac components from a phase error signal which is the product of a sinusoidal or square wave source signal and a corresponding reference signal synthesized from a variable frequency signal produced by a voltage controlled oscillator as a function of the integratal of the phase error signal. The sliding window averager maintains a running average of a number of most recent samples of the phase error signal taken over a selected interval which is preferably one-half cycle of the source signal. Also preferably, the sliding window averager is clocked by the variable frequency signal generated by the voltage controlled oscillator.

21 Claims, 4 Drawing Sheets

WIDE BANDWIDTH PHASE LOCKED LOOP CIRCUIT WITH SLIDING WINDOW AVERAGER

BACKGROUND OF THE INVENTION

1. Field of the Invention

This invention relates to single and multiphase phase locked loop circuits in which the phase error between a source signal and a digitally synthesized reference signal is integrated and applied to a voltage controlled oscillator which shifts the phase of the digitally synthesized reference signal to reduce the phase error signal to zero when the synthesized reference signal has a predetermined phase relationship to the source. More particularly, the invention relates to such phase locked loop circuits incorporating a sliding window averager for improved stability and response time.

2. Background Information

Control and monitoring circuits for many power electronic applications require timing reference signals that are precisely locked to the fundamental component of the source. Phase locked loop circuits have been developed which generate such timing reference signals. The heart of these phase locked loop circuits is a phase comparator and a voltage controlled oscillator (VCO). The phase comparator compares the source signal with a synthesized reference signal to generate a phase error signal which is integrated and applied to the voltage controlled oscillator to generate a signal having a frequency which varies with the phase error. This variable frequency signal is then used to shift the phase of a synthesized reference signal to drive the phase error signal to zero. In order to be frequency selective, multiplying phase comparators are used to compare the source signal with the synthesized reference signal. Phase comparators of this sort produce an output with a mean value which is a function of the phase error. They also produce a dominant ac component which is the second harmonic of the source and may produce other ac components depending upon the nature of the input waveform.

In the normal working range, that is close to phase lock, the dc error is closely proportional to the actual phase error. When the reference wave leads the input by less than 90 degrees, the dc component becomes more positive. When the output leads by more than 90 degrees, the output will become negative. Phase lock is maintained because the integral of the phase error signal and the VCO frequency continue to change until the phase error is eliminated. Since the phase error signal from the phase comparator is predominantly second harmonic, and may contain some other frequency components if the input is distorted, a means to neutralize or attenuate these components is necessary to minimize harmonic modulation of the VCO frequency. A slow responding integrator or filters have been used to maintain the frequency modulation of the VCO to an acceptable low level However, these devices reduce the bandwidth of the phase locked loop circuit. As a result, the output is a compromise of response time and accuracy.

U.S. Pat. No. 4,669,024 discloses a three-phase phase locked loop circuit which individually multiplies each phase of the source by the corresponding phase of a three-phase reference signal. These three separate phase error signals are then summed to produce a total phase error signal which is integrated and applied to the VCO. As long as the three phases of the source signal are balanced, summing of the individual phase error signals results in cancellation of the major second harmonic ac components and the total phase error signal, thereby enabling the use of a faster slewing integrator and elimination of the filter. While the phase lock loop of U.S. Pat. No. 4,669,024 eliminates these ac components for ideal balanced three-phase inputs by summing the three-phase error signals from three identical phase comparators, in the case of unbalanced multiphase and single phase inputs, some second harmonic remains and a slow responding integrator or filter is still required to keep the frequency modulation of the VCO to an acceptably low level.

Accordingly, there is a need for a phase locked loop circuit without significant ripple in the phase error signal even with unbalanced three-phase and single phase inputs.

There is also a need for such a phase lock loop circuit which is easily and economically incorporated into present phase lock loop circuits.

SUMMARY OF THE INVENTION

These and other objects are realized by the invention which is directed to single and multiphase phase lock loop circuits in which the phase error signal generated by multiplying the source signal by a synthesized reference signal in multiplying phase comparators is applied to a sliding wave averager circuit which substantially removes ripple from the phase error signal. The sliding wave averager circuit samples the phase error signal at a predetermined sampling rate over a selected interval and maintains a running average of the most recent samples. Since the frequency of the ripple is normally twice that of the source, preferably the phase error signal is averaged over one-half cycle of the source, although any desired averaging interval could be used. Also, any source of clocking pulses can be used to drive the sliding window averager, but it is preferred that the variable frequency signal generated by the voltage controlled oscillator be used to clock the sliding window averager, thus eliminating the need for a separate clock.

When used with a sinusoidal input signal, the variable frequency signal generated by the VCO is applied to a counter which cyclically generates a phase angle output signal. This phase angle output signal is used to address a ROM in which are stored instantaneous values for the sinusoidal reference signal which is compared with the source signal. Where the source signal is a square wave, the output of the VCO can be used as the reference signal. However, if the VCO is also used to clock the sliding window averager, the VCO must generate pulses at the required sampling rate. The variable frequency signal generated by the VCO must then be divided by the number of samples per cycle of the source in order to generate the reference signal which is fed back for comparison with the source signal. Also, since the square wave signal has a value of one or zero, one-half the magnitude of the square wave phase error signal must be subtracted from the phase error signal before application to the integrator so that the phase error signal which is integrated has a value of zero when the loop is in phase lock.

The phase locked loop circuits of the invention can be used with source and reference signals which are distorted, such as where one is a sine wave and the other is a square wave and with three phase signals which are unbalanced. With balanced three phase input and reference signals where one is a sine wave and the other is a square wave, the ripple will have a frequency six times the fundamental frequency of the source. In such a case, the sliding window averager need only average samples over one-sixth cycle of the source to remove the ripple.

BRIEF DESCRIPTION OF THE DRAWINGS

A full understanding of the invention can be gained from the following description of the preferred embodiment when read in conjunction with the accompanying drawings in which.

DESCRIPTION OF THE PREFERRED EMBODIMENTS

Figure 1:
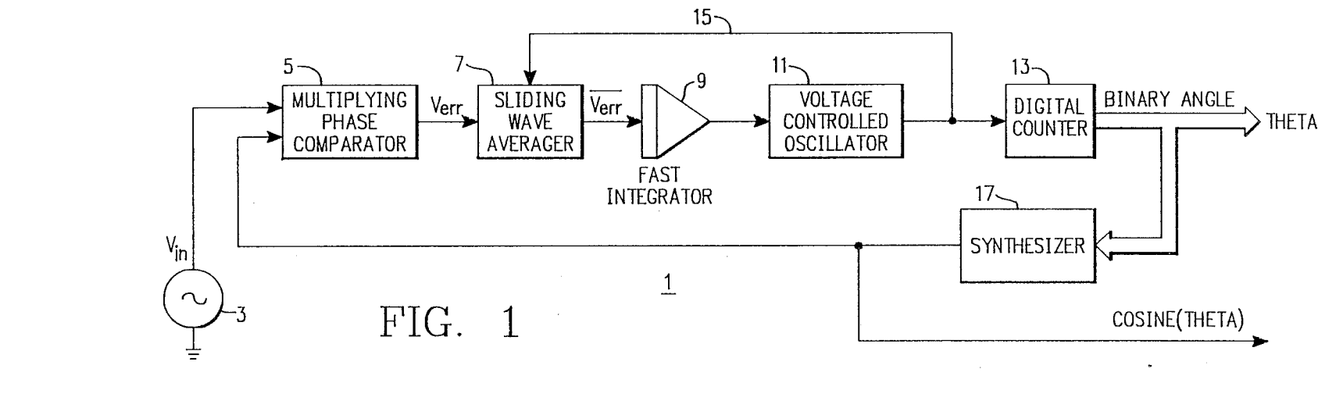
FIG. 1 is schematic diagram of a single phase phase lock loop circuit in accordance with the invention for use with sinusoidal input signals.
Figure 2A:
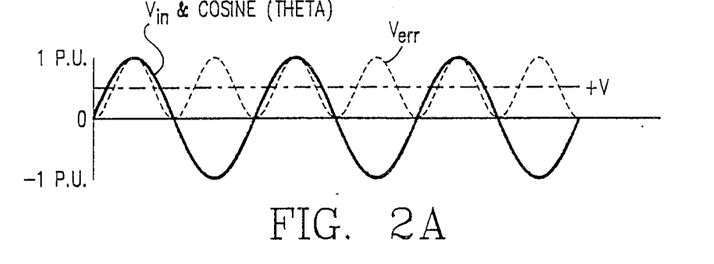
FIGS. 2A, 2B and 2C illustrate phase error signals generated by the phase lock loop circuit of FIG. 1 where the source signal and synthesized reference signal are in phase, are 180 degrees out of phase and when they are in quadrature, respectively.
Figure 2B:
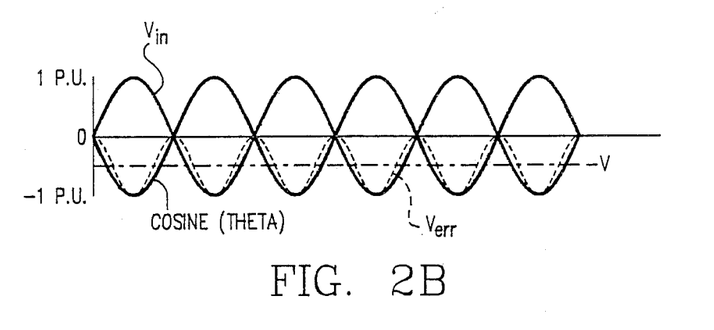
Figure 2C:
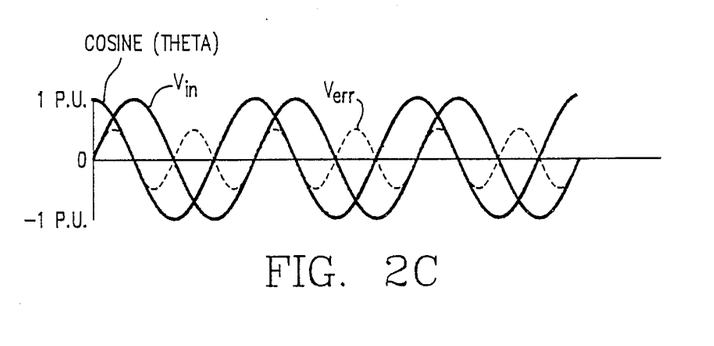

FIG. 1 illustrates a single phase locked loop circuit (PLL) 1 in accordance with the invention which produces an output, in this instance in the form of a digital signal representing the angle Theta, which is phase locked in a predetermined phase relationship to a sinusoidal source signal $V_{in}$ provided by an ac source 3. The PLL 1 includes a multiplying phase comparator 5 which compares the phase of the source signal $V_{in}$ to that of a synthesized referenced waveform, Cosine (Theta). The comparison is made by multiplying the two waveforms. In this exemplary PLL, analog multipliers are used. The produce of this multiplication is a phase error signal $V_{err}$ having a dc component which is a function of the phase error. It also has a dominant ac component which is the second harmonic of the frequency of the source signal $V_{in}$. FIGS. 2A, 2B and 2C illustrate the typical waveforms of the phase error signal $V_{err}$ which is the product of $V_{in} \times$ Cosine (Theta). FIG. 2C illustrates the instance where $V_{in}$ and Cosine Theta are in phase which produces $V_{err}$ having twice the frequency and a positive dc component of $+V$. FIG. 2B illustrates the instance where the reference signal is 180 degrees out of phase with the source signal and the resultant error signal $V_{err}$ has a negative dc component of $-V$. FIg. 2C illustrates the instance where the source and reference signals are in quadrature with the reference signal leading. In this instance, the dc component of the error signal $V_{err}$ is zero and represents the phase locked condition.

The phase error signal $V_{err}$ is applied to a sliding window average circuit 7 which generates a running average $\overline{V_{err}}$ from a predetermined number of most recent samples of the error signal $V_{err}$. This average error signal $\overline{V_{err}}$, is applied to an integrator 9 which generates an integrated average error signal. The integrated average error signal is applied to a voltage controlled oscillator (VCO) 11 which generates a signal having a frequency proportional to the magnitude of the integrated average error signal. This signal generated by the VCO is applied to a digital counter 13 which cyclically counts pulses in the output of the VCO. In other words, the counter 13 repetitively counts up to a predetermined number and then begins over again. The count generated by this counter represents the output Theta which is phase locked at a predetermined phase angle to the source signal $V_{in}$. The frequency signal generated by the voltage controlled oscillator 11 is fed back over a conductor 15 to the sliding window averager 7 as a clocking signal. In the example, the output signal Theta is a binary representation of the count maintained by the digital counter 13.

The count signal Theta is applied to a synthesizer 17 which has stored in sequential addresses of a ROM (read only memory) binary numbers representing the magnitude of a sinusoidal waveform at sequential instants in time. The count from counter 13 is used to sequentially address the ROM which outputs stored binary numbers representing the instantaneous magnitude of the ac waveform. These binary numbers are converted by a digital to analog converter in the synthesizer into the analog reference signal, Cosine (Theta). The average error between Cosine (Theta) and $V_{in}$ is integrated and results in a change in the frequency of the output generated by the VCO 11. This changes the rate at which the count accumulates in the counter 13 which in turn shifts the phase of the Cosine (Theta) signal. The sense of the error is such that the phase of Theta, and therefore of Cosine (Theta), is shifted until the error is reduced to zero. As discussed in connection with FIGS. 2A, 2B and 2C, this will occur when the reference signal, Cosine (Theta), is in quadrature with $V_{in}$. The addresses in which the sequential instantaneous values of the reference waveform are stored in the ROM can be adjusted so that the reference signal is in quadrature with $V_{in}$ at any predetermined phase relationship between the count, Theta, and $V_{in}$. This reference waveform which is in quadrature with the source signal at phase lock, can also be used as an output signal.

As can be appreciated from FIG. 2c, even at phase lock, where the error signal $V_{err}$ has a mean value of zero, the instantaneous value is a sinusoid which is the second harmonic of $V_{in}$. In prior art PLLs, either a slow integrator or a low pass filter was required to reduce the instability produced by this second harmonic. However, both slow integrator and low pass filter reduce the response time of the PLL. In accordance with the present invention, the integrator 9 is a fast integrator which integrates the average error signal $\overline{V_{err}}$ generated by the sliding window averager 7. While the error signal can be averaged over any desired interval, in the preferred form of the invention, the sliding window averager 7 averages the error signal $V_{err}$ over one full cycle of its ac component. Since, as shown in FIG. 2, this ac component has a frequency which is twice that of $V_{in}$, the sliding window averager 7 averages over one-half cycle of the source voltage $V_{in}$. The sliding window averager 7 takes N samples of $V_{err}$ over one-half cycle of the $V_{in}$, adds them together and divides by N to generate the average error signal $\overline{V_{err}}$. By adding in each new sample and discarding the oldest sample the sliding window averager maintains a running average of the most recent N samples of $V_{err}$.

Figure 3:
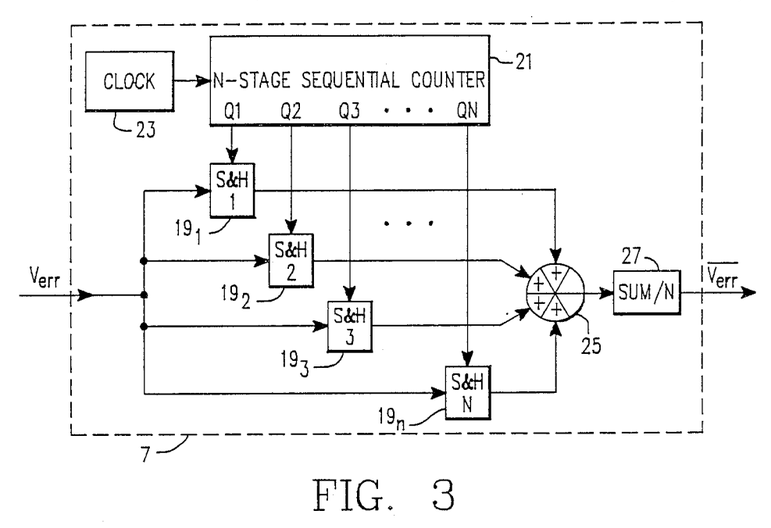
FIG. 3 is a schematic diagram of a sliding window averager suitable for use with the phase lock loop circuit of FIG. 1.

An example of a suitable sliding window averager 7 is illustrated in FIG. 3. $V_{err}$ is applied in parallel to N sample and hold circuits $19_1$ through $19_N$. An N-stage sequential counter 21 sequentially applies a control signal Q1 through QN to the sample and hold circuits $19_1$ through $19_N$ respectively. The N stage-sequential counter 21 is driven by a clock 23. This clock 23 can be an independent clock which generates clock pulses at the rate of N pulses for the desired averaging period, such as one-half cycle of $V_{in}$. Preferably, however, as shown in FIG. 1, the clock pulses are provided by the voltage controlled oscillator 11. In either case, the sample and hold circuits $19_1$ to $19_N$ sequentially, at successive clock pulses, store the instantaneous analog value of $V_{err}$. The values of $V_{err}$ stored by each of the sample and hold circuits $19_1$ through $19_N$ are summed by the summing junction 25 to generate a sum which is divided by N in the divider 27 to produce the average error signal $\overline{V_{err}}$. When the Q1 output of the N stage sequential counter again goes to one, the oldest stored value of $V_{err}$ is replaced by the most current value. On successive clock pulses, the oldest samples stored in sample and hold circuits $19_2$, $19_3$ et cetera are replaced by the most current value of $V_{err}$. Thus, the sample and hold circuits $19_1$ through $19_N$ always contain the N most recent samples of $V_{err}$.

The PLL 1 of FIG. 1 provides a phase lock loop which is stable yet has a fast response time. Thus, the circuit is suitable for use, for instance, in wide bandwidth control systems.

Figure 4:
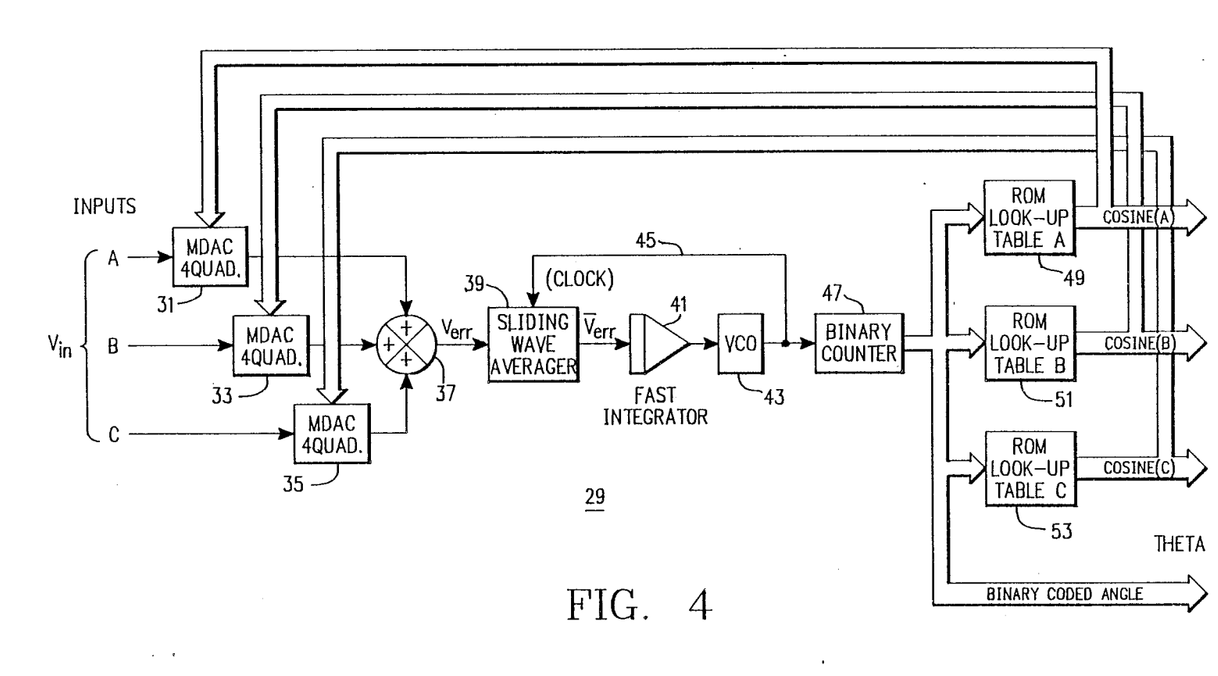
FIG. 4 is a schematic diagram of a three phase phase lock loop circuit in accordance with the invention for use with sinusoidal source signals.

FIG. 4 illustrates application of the invention to a three-phase PLL 29. In this PLL, each phase A, B and C of a source signal is individually compared with a corresponding phase, Cosine (A), Cosine (B), and Cosine (C) of a three-phase reference signal in a phase comparator 31, 33 and 35, respectively. In this embodiment of the invention, the reference signals Cosine (A), Cosine (B) and Cosine (C) are all in digital form and the phase comparators 31, 33 and 35 which compare the phase of these digital signals with the analog input signals are four quadrant multiplying digital to analog converters. The outputs of these phase comparators 31, 33 and 35 represent the phase error between the reference signal and the input signal for each individual phase. These individual phase error signals are summed in summing junction 37 to produce the composite phase error signal $V_{err}$ which is averaged by the sliding window averager 39 to produce the average error signal $\overline{V_{err}}$ as in the case of the single phase PLL 1 in FIG. 1. The average error signal $\overline{V_{err}}$ is integrated by a fast integrator 41 to produce an integrated average error signal which drives the voltage controlled oscillator (VCO) 43. Again, the output of the VCO is fed back over a lead 45 to clock the sliding window averager 39, and is applied to a binary counter 47 which generates in binary coded form the output signal Theta which is phase locked to the three-phase source signal. The cyclical count generated by the binary counter 47 is also used to address three ROMs 49, 51 and 53 in which are stored on look up tables A, B and C binary representations of the instantaneous magnitude of the three phases, Cosine (A), Cosine (B), and Cosine (C), of the reference signal. Again, the instantaneous magnitudes of the three-phase signals are stored in the ROMs 49, 51, and 53 in a sequence which produces the desired phase relationship between the output signal Theta and the input signal when the three phases of the reference signal are in quadrature with the corresponding phases of the input signal so that the total error signal $V_{err}$ is zero.

As explained in U.S. Pat. No. 4,669,024, there is no ripple in the composite error signal $V_{err}$ when the three phases A, B, and C of $V_{in}$ are balanced. However, the composite error signal will contain ripple if the phases of the input signal $V_{in}$ are not balanced. The sliding window averager 39 removes this ripple in the composite error signal in the same manner as described in connection with the single phase PLL discussed in connection with FIG. 1. The exemplary sliding window averager shown in FIG. 3 can be used for the averager 39 in FIG. 4.

The invention is also applicable to three-phase phase locked loop circuits in which the source and reference signals are square waves. Such signals are inherently balanced, but will have a ripple component with a frequency six times the source fundamental frequency. This ripple can be removed by the sliding window averager operating with a window equal to one-sixth of the cycle of the source fundamental frequency.

Figure 5:
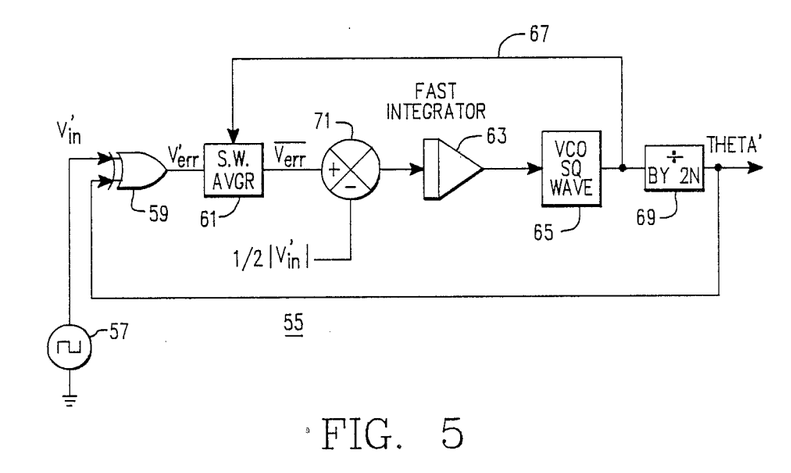
FIG. 5 is a schematic diagram of a single phase digital phase lock loop circuit in accordance with the invention.

FIG. 5 illustrates a single phase PLL 55 in accordance with the invention for use with a single phase square wave input signal. In this PLL, the digital input signal generated by the square wave source 57 is compared with a reference square wave signal in a phase comparator 59 in the form of an exclusive OR circuit. The digital error signal $V_{err}'$ is applied to the sliding window averager 61 to produce the analog average error signal $\overline{V_{err}}$. The analog average error signal $\overline{V_{err}}$ is again integrated in a fast integrator 63 to produce an integrated average error signal which drives the voltage controlled oscillator (VCO) 65. The square wave generated by the VCO 65 is fed back over lead 67 as the clock signal for the sliding window averager 61. Since the output of the VCO is being used to generate the clock signal for the sliding window averager, it must generate a square wave having N pulses during the period over which the error signal is to be averaged. Since it is preferred to average the error signal over one-half the cycle of the input signal, the VCO should have a frequency which is 2N times the frequency of the square wave input signal $V_{in}'$. In order to generate an output signal in a reference signal which has the same frequency as the input signal, the output of the VCO 65 is divided by 2N in a divider circuit 69. The square wave output signal Theta' also serves as a reference signal which is compared with the input signal $V_{in}'$. Again, when the reference signal Theta' is in quadrature with the input signal $V_{in}'$, the digital error $V_{err}'$ will be zero and Theta' will be phase locked to $V_{in}$.

Where the input signal is a pulse signal having a positive value or zero, the digital error signal $V_{err}'$ will have an average dc value equal to one-half the magnitude of the input pulse signal when the output signal Theta' is phase locked to the input signal $V_{in}'$. Therefore, in order to have zero input to the integrator 63 at phase lock, a dc bias signal equal to one-half the magnitude of the input pulse signal $V_{in}'$ is subtracted from the average signal $\overline{V_{err}}$ in summing junction 71 so that the input to the integrator 63 at phase lock is zero.

Figure 6:
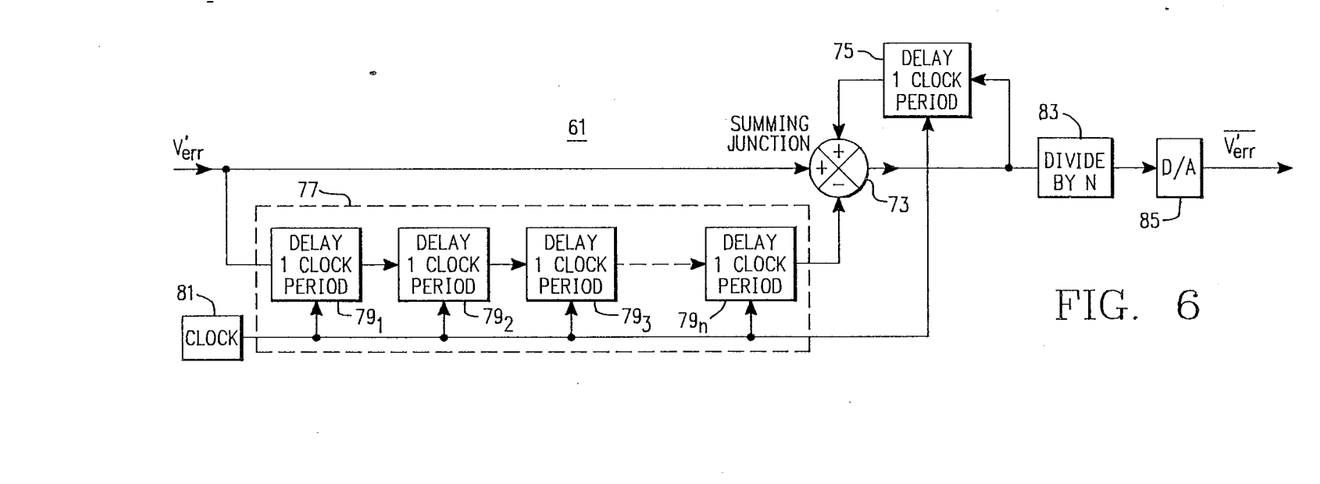
FIG. 6 is a schematic diagram of a sliding window averager suitable for use with the phase loop circuit of FIG. 5.

FIG. 6 illustrates a digital sliding window averager 61 suitable for use in the digital PLL 55 of FIG. 5. In the PLL 55, the digital error signal $V_{err}'$ is a logic signal having a one or a zero value. The one bit error signal $V_{err}'$ is added in a digital summing junction 73 to an accumulated sum stored in a single stage delay 75 with the new sum stored in the delay 75. The delay 75 and the summing junction 73 are multi-bit devices so that the total value of N samples can be accumulated. The one bit digital signal $V_{err}'$ is also applied to an N-stage delay line or shift register 77. This delay line or shift register 77 has N one bit stages $79_1$ through $79_N$. The delay line or shift register 77 is clocked by pulses from a clock 81, which as discussed could be the VCO 65. The clock pulses shift the digital samples through the N stages of the delay line or shift register 77. The sample in the last stage $79_n$ is subtracted in digital summing junction 73 from the sample sum which accumulates in delay stage 75.

The subtraction of the sample in the last stage $79_N$ of the delay line or shift register 77 removes the oldest sample from the accumulated sample sum so that this sum represents the sum of the N most recent samples. This sum is then divided by N in divider circuit 83 to generate a digital average value for the $V_{err}'$. This digital average error signal is converted to an analog signal $\overline{V_{err}'}$ by digital to analog converter 85 to produce the analog average error signal required by the integrator in the PLL.

The invention further applies to phase locked loop currents in which either the source or the synthesized reference signal is a sine wave and the other is a square wave. For such circuits which are three phase and wherein the phases are balanced, the phase error signal will have ripple with a frequency which is six times the fundamental frequency of the source. This ripple can be removed by a sliding window averager which maintains a running average of samples taken over one-sixth cycle of the source. If the phases are unbalanced, the sliding window averager will have to average the phase error signal over one-half cycle of the source to remove the ripple which will have a frequency two times that of the source.

The single and multiphase, analog and digital phase locked loop circuits in accordance with the invention produce a precise output free from frequency or phase modulation. The output phase locks to the fundamental frequency component of a highly distorted single or multiphase source. For multiphase applications, phase lock loop circuits in accordance with the invention lock to the fundamental positive sequence set of symmetrical components. While hardware implementations of the sliding window averager used in the phase lock loop circuits of the invention have been specifically disclosed, it will be appreciated that the sliding window averager can also be implemented with a microprocessor.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A phase locked loop circuit comprising:

phase comparator means generating a phase error signal representative of a phase error between a source signal having a selected fundamental frequency and a synthesized reference signal having a predetermined phase relationship to the source signal, a sliding window averager generating an average phase error signal from a predetermined number of most recent samples of said phase error signal taken at clocked intervals determined by a clock signal, means providing said clock signal at a frequency greater than the fundamental frequency of said source signal, and reference signal generating means generating said synthesized reference signal having said predetermined phase relationship to said source signal, said reference signal generating means being responsive to said average phase error signal to vary the phase of said synthesized reference signal to decrease the phase error in the predetermined phase relationship between the source signal and the synthesized reference signal thereby locking the synthesized reference signal in the predetermined phase relationship to the source signal when the average phase error signal is substantially zero.

2. The phase locked loop of claim 1 wherein said reference signal generating means includes an integrator operative to integrate the average phase error signal to produce a dc signal substantially proportional to the integrated value of the average phase error signal, a voltage controlled oscillator which is operative to generate a variable frequency output signal having a frequency dependent upon the magnitude of said dc signal generated by said integrator, and synthesizing means digitally generating said synthesized reference signal having said predetermined phase relationship to said source signal, said synthesizing means being responsive to said variable frequency signal generated by the voltage controlled oscillator to vary the phase of the synthesized reference signal to decrease the phase error in the predetermined phase relationship between the source signal and the synthesized reference signal to substantially zero, and wherein said means providing said clock signal comprises means dependent upon the frequency of the output signal generated by the voltage controlled oscillator.

3. The phase locked loop circuit of claim 2 wherein said voltage controlled oscillator generates said variable frequency signal at a frequency equal at least to said predetermined number of samples averaged by said sliding window averager times the frequency of said source signal with the phase error substantially zero, and with the frequency of said variable frequency signal varying therefrom dependent upon the value of the phase error signal.

4. The phase locked loop circuit of claim 3 wherein said voltage controlled oscillator generates said variable frequency signal with a frequency equal to twice the number of samples averaged by said sliding window averager times the frequency of said source signal when said phase error signal is substantially zero and wherein said means providing said clock signal comprises means applying the variable frequency signal generated by the voltage controlled oscillator to the sliding window averager as the clock signal.

5. The phase locked loop circuit of claim 2 wherein said source signal is sinusoidal and wherein said synthesizing means generates a sinusoidal synthesized reference signal having said predetermined phase relationship to said sinusoidal source signal at phase lock.

6. The phase locked loop circuit of claim 5 wherein said source signal is a three-phase sinusoidal signal and wherein said synthesizing means generates a three-phase sinusoidal synthesized reference signal having said predetermined phase relationship to said three-phase source signal at phase lock.

7. The phase locked loop circuit of claim 2 wherein said source signal is a square wave, wherein said voltage controlled oscillator generates a square wave variable frequency signal having a frequency when the phase error signal is substantially zero equal to at least said predetermined number of samples times the frequency of the square wave source signal, wherein said synthesizing means comprises means dividing said square wave output signal generated by the voltage controlled oscillator by a divisor which produces a square wave synthesized signal having a frequency substantially equal to the frequency of the square wave source signal when said phase error signal is substantially zero, and including means subtracting from the average phase error signal generated by said sliding window averager for application to said integrator a sum which makes the average phase error signal equal to zero when the square wave synthesized signal is phase locked in said predetermined phase relationship to said source signal.

8. The phase locked loop circuit of claim 7 wherein said voltage controlled oscillator generates a square wave variable frequency signal having a frequency equal to a selected factor times the predetermined number of samples times the frequency of the square wave source when the phase error signal is zero, and wherein said synthesizer means divides said voltage controlled oscillator variable frequency signal by said selected factor times said predetermined number of samples.

9. The phase locked loop circuit of claim 8 wherein said selected factor is 2 whereby said predetermined number of samples are taken over one half of a cycle of said square wave source signal.

10. The phase locked loop circuit of claim 1 wherein said means providing said clock signal provides a clock signal having a frequency at which said predetermined number of samples of said phase error signal are taken substantially over a preselected portion of a cycle of said source signal.

11. The phase locked loop circuit of claim 10 wherein said preselected portion is one-half cycle of said source signal.

12. The phase locked loop circuit of claim 2 wherein one of said source signal and reference signal is sinusoidal and the other is a square wave signal.

13. The phase locked loop circuit of claim 12 wherein said source signal and said reference signal are each three phase.

14. The phase locked loop circuit of claim 13 wherein said means providing a clock signal provides a clock signal having a frequency at which said predetermined number of samples of said phase error signal are taken over no more than one-half cycle of said source signal.

15. The phase locked loop circuit of claim 14 wherein the clock signal has a frequency at which said predetermined number of samples of said phase error signal are taken over about one-sixth cycle of said source signal.

16. A phase locked loop circuit comprising:
phase comparator means generating a phase error signal representative of a phase error between a sinusoidal source signal and a digitally synthesized sinusoidal reference signal having a predetermined phase relationship to said sinusoidal source signal,
a sliding window averaging circuit generating an average phase error signal from a predetermined number of most recent samples of said phase error signal taken at clocked intervals determined by the pulses of a clock signal,
phase shifting means generating a variable frequency signal which shifts the phase of the digitally synthesized sinusoidal reference signal in response to the average phase error signal to reduce the phase error in said predetermined phase relationship between the sinusoidal source signal and the digitally synthesized sinusoidal reference signal,
means feeding back the variable frequency signal generated by said phase shifting means to said sliding window averaging circuit as said clock signal, and
synthesizer means digitally generating said digitally synthesized sinusoidal reference signal in response to said variable frequency signal to decrease the phase error in the predetermined phase relationship between the sinusoidal source signal and the digitally synthesized reference signal thereby locking the digitally synthesized sinusoidal reference signal in the predetermined phase relationship to the sinusoidal source signal when the average phase error signal is substantially zero.

17. The phase locked loop circuit of claim 16 wherein said source signal is a three-phase sinusoidal source signal, said synthesizer means generates a three-phase digitally synthesized sinusoidal reference signal having said predetermined phase relationship to said source signal and wherein said phase comparator means comprises means comparing said source signal and reference signal phase by phase to generate phase by phase error signals and means combining said phase by phase error signals to generate said phase error signal.

18. A phase locked loop circuit comprising:
multiplying phase comparator means generating a square wave phase error signal representative of a relative phase between a square wave source signal and a square wave synthesized reference signal having a predetermined phase relationship to said square wave source signal, said square wave phase error signal having a fixed magnitude and having a fifty percent duty cycle at phase lock,
a sliding window averager generating an average phase error signal from a predetermined number of most recent samples of said phase error signal taken at clocked intervals determined by the pulses of a clock signal,
means integrating said average phase error signal to generate an integrated average phase error signal,
a voltage controlled oscillator generating a variable frequency square wave signal having a frequency which varies in response to said integrated average phase error signal to shift the phase of said square wave reference signal to drive said average phase error signal to substantially zero, said variable frequency square wave signal having a frequency equal to a selected factor times said predetermined number of samples times the frequency of said square wave source signal when said average phase error signal is substantially zero,
means applying said variable frequency square wave signal generated by the voltage controlled oscillator to the sliding window averager as said clock signal, and
synthesizing means generating said square wave synthesized reference signal having said predetermined phase relationship to said square wave source signal, said synthesizer means comprising a divider dividing said variable frequency square wave signal by said selected factor times said predetermined number of samples.

19. The phase locked loop circuit of claim 18 wherein said selected factor is two such that said predetermined number of most recent samples of said phase error signal is taken in about one-half cycle of said square wave source signal.

20. The phase locked loop circuit of claim 19 wherein said multiplying phase comparator means is an exclusive OR circuit, said phase locked loop circuit including:

means adjusting said average phase error signal by subtracting one-half said fixed magnitude from said average phase error signal to generate an adjusted, average phase error signal which is applied to said integrating means.

21. The phase locked loop circuit of claim 18 wherein said source signal and synthesized reference signal are both three phase signals and wherein said selected factor is six such that said predetermined number of most recent samples of said phase error signal is taken in about one-sixth cycle of said square wave source signal.

* * * * *